United States Patent
Layton

[11] Patent Number: 5,899,001
[45] Date of Patent: May 4, 1999

[54] LAMINAR FLOW SYSTEM FOR DRYING CRITICAL PARTS

[76] Inventor: Howard M. Layton, 11 Falmouth Ct., Brookfield, Conn. 06804

[21] Appl. No.: 08/858,490

[22] Filed: May 19, 1997

[51] Int. Cl.[6] .................................................... F26B 21/06
[52] U.S. Cl. ........................ 34/77; 34/80; 34/82; 219/400
[58] Field of Search .................................. 34/77, 80, 82, 34/233, 234; 219/369, 370, 373, 400

[56] References Cited

U.S. PATENT DOCUMENTS

| | | | |
|---|---|---|---|
| 3,538,615 | 11/1970 | Fuhring et al. | 34/77 |
| 3,650,040 | 3/1972 | Statham et al. | 34/77 |
| 3,652,825 | 3/1972 | Layton | 219/373 |
| 3,875,683 | 4/1975 | Waters | 34/174 |
| 4,493,333 | 1/1985 | Layton | 134/76 |
| 4,656,757 | 4/1987 | Oschmann | 34/27 |
| 5,048,201 | 9/1991 | Layton | 34/77 |
| 5,105,557 | 4/1992 | Vadasz et al. | 34/14 |
| 5,238,477 | 8/1993 | Layton | 55/497 |

*Primary Examiner*—Henry Bennett
*Assistant Examiner*—Pamela A. Wilson
*Attorney, Agent, or Firm*—Michael Ebert

[57] ABSTRACT

A system adapted to dry microelectronic, optical or other critical parts which in the course of their processing are rendered wet and become contaminated unless fully dried. The system includes an upright drying chamber having an inlet at its lower end and an outlet at its upper end, the parts to be dried being supported in a work zone between the inlet and outlet. Coupled to the inlet of the drying chamber is an input chamber having a blower therein which blows heated gas into the drying chamber through a filter unit covering the inlet thereto The blower creates a negative pressure in the input chamber and a positive pressure in the drying chamber in which the filtered heated gas acts to evaporate moisture from the parts in the work zone. Surrounding the drying chamber and communicating with the input chamber is an annular duct which due to the negative pressure in the input chamber draws heated moist gas from the outlet of the drying chamber into the input chamber for recirculation in the drying chamber in a toroidal flow patterns Because the heated gas flowing through the annular duct envelopes the drying chamber, it acts to maintain this chamber at a uniform operating temperature to promote uniform drying of the parts.

12 Claims, 1 Drawing Sheet

LAMINAR FLOW SYSTEM FOR DRYING CRITICAL PARTS

BACKGROUND OF INVENTION

1. Field of Invention:

This invention relates generally to systems for drying microelectronic, optical or other critical parts which in the course of their processing are rendered wet with water or other liquids, and more particularly to a system in which the parts to be dried are subjected to a laminar flow of heated gas in a toroidal flow pattern which promotes uniform evaporative drying of these parts 2. Status of Prior Art:

In critical parts drying systems of the type currently in use in fabricating integrated circuit silicon wafers and other microelectronic devices, in which the parts are rendered wet in the course of their processing, in order to achieve optimum cleanliness and a high yield of uncontaminated parts it is vital that the wet parts be subjected to uniform treatment throughout the work zone of the drying chambers.

Thus if the parts to be dried are supported within a chamber into which is fed a heated gas to promote evaporative drying, and no means are included to govern or direct the gas stream being fed into the chamber, stagnant pockets of gas will develop in those regions of the chamber which are displaced from this gas stream, and not all of these parts will be adequately dried. Because some of the parts remain contaminated by residual moisture, their quality is impaired.

With a view to producing more satisfactory gas flow patterns in a critical parts drying system, it is known to use for this purpose flow diffusers, such as perforated screens, baffles, and other expedients to modify or split up the gas stream to create a desirable flow pattern. However, the stringent demands now imposed on process control are such that deflectors and other means for modifying gas flow are inadequate, and satisfactory drying results are not realized.

In order to overcome these drawbacks, the U.S. Pat. No. 3,543,776 to Layton discloses a drying chamber in which the parts to be dried in a work zone are subjected to the flow of a heated inert gas, such as nitrogen. The arrangement is such that the gas flow pattern is laminar, thereby effecting a uniform and efficient drying action.

The advantage of a laminar flow pattern over a pattern that is somewhat turbulent is that it helps to avoid streaking and water spotting, thereby ensuring complete and uniform drying.

To this end, incoming gas is fed into a pressure chamber disposed below the work zone in the drying chamber, the pressure chamber being covered by a porous membrane. Under this membrane is a diffuser screen which prevents the gas from directly striking the membrane. As a result, the incoming gas which fills the pressure chamber filters through the membrane into the work zone thereabove in the drying chamber, the membrane producing a pressure differential and hence laminar flow in the work zone.

In practice, the membrane used to establish a laminar flow of nitrogen has a limited ability to serve as an effective particulate filter except for slow gas flow rates. The reason for this limitation is that in all but the smallest pressure chambers, it is necessary that the membrane have a fairly large pore size, otherwise one runs the risk of membrane rupture. To make possible greater flow rates without damaging the membrane, carefully designed membrane supports are provided to this end. But, in general, it was found necessary to augment gas filtration with an auxiliary filter in the gas supply line in all but laboratory scale versions of the drying chamber.

The need to use an auxiliary in-line submicron filter did not impose serious limitations on the utility of the evaporative drying chamber until the disadvantages of solvent drying and the environmental problems created thereby led to a growing interest in the use of evaporative drying in areas other than semiconductor and integrated-circuit processing, using purified air instead of nitrogen. Thus the precision optics industry and even the eyeglass lens processing industry are at present actively engaged in replacing existing hydrocarbon and fluorocarbon solvent drying systems with other available and cost effective methods.

In my prior Layton U.S. Pat. No. 5,049,201, there is disclosed a parts drying system in which the parts to be dried are subjected to a laminar flow stream created by a high-efficiency particulate air filter unit of the Hepa type which ensures point-of-use submicron filtration with minimal pressure drop. As a consequence, one may use a low-pressure blower to draw in environmental ambient air rather than more costly purified compressed air or dry nitrogen.

The system in the Layton '201 patent includes an open-ended drying chamber having a work zone in which the parts to be dried are supported for exposure to a gas stream One end of the chamber defines a gas inlet to admit the gas stream which sweeps the entire chamber. Coupled to the drying chamber is a pressure chamber in which a submicron particle filter unit of the Hepa type producing a relatively low pressure drop is disposed to cover the gas inlet. Gas fed into the pressure chamber and heated to an elevated temperature imposes a distributed pressure on the entry face of the filter unit and passes therethrough to yield at its exit face a laminar stream of hot gas that subjects the parts in the work zone to a substantially uniform drying action. In this way all parts being treated are fully dried.

In order to conserve thermal energy and render the system more efficient in operations the '201 Layton patent system includes a duct which couples the outlet of the drying chamber to the pressure chamber. The duct acts to return heated gas emerging from the outlet of the drying chamber back to the pressure chamber for recirculation through the system.

When this system operates in a recirculating mode, the vapor content of the recirculating heated gas increases in the course of a drying operation. It is necessary therefore from time-to-time to purge the vapor-laden gas into the atmosphere and to thereafter resume operation with a fresh supply of dry gas. To this end my prior '201 Layton system includes gates which can be switched from a position in which moist gas is recirculated by way of the duct, to a position in which the moist gas is exhausted into the atmosphere.

In the prior '201 Layton patent system, in order to maintain an operating temperature in the drying chamber that is uniform and therefore effects uniform drying of the parts, attached to the walls of the drying chamber are external heating blankets These blankets which supplement the electrical heater element in the pressure chamber contribute substantially to the cost of manufacturing the system and they also add to energy operating costs.

SUMMARY OF INVENTION

In view of the foregoing, the main object of this invention is to provide an improved critical parts drying system which subjects wet parts in a drying chamber to a laminar flow of heated gas acting to uniformly dry the parts.

More particularly, an object of this invention is to provide a system of the above type in which the drying chamber is surrounded by an annular duct through which heated gas emerging from the outlet of the drying chamber is returned to the inlet of this chamber to be recirculated therein to conserve thermal energy.

Among the significant features of the invention are the following:

A. Because the recirculating flow of gas through the annular duct surrounding the drying chamber assumes a toroidal flow pattern which is intercepted only by the wet parts in the work zone, these parts are subjected to uniform heat and are uniformly dried so that no residual moisture remains on any of the parts.

B. Because the heated gas flowing through the annular duct envelopes the drying chamber, it acts to maintain this chamber at a uniform temperature to promote uniform drying of the parts in the work zone.

C. Because the annular duct which surrounds the drying chamber has its inlet adjacent the outlet of the drying chamber whereby moist gas emerging from the outlet can be drawn into the duct, the duct inlet which is exposed to the atmosphere can also draw in ambient dry gas to intermingle with the moist gas.

Also an object of the invention is to provide a drying system of the above type in which heating elements are distributed about the walls of the annular duct to ensure uniform heating of the recirculating gas flowing therethrough and thereby afford optimal thermal efficiency.

Yet another object of the invention is to provide an adjustable damper covering the drying chamber adapted to vary the relative degree to which moist heated gas emerging from the chamber is recirculated therein and is purged into the atmosphere.

Briefly stated, these objects are attained by a system adapted to dry microelectronic, optical or other critical parts which in the course of their processing are rendered wet and become contaminated unless fully dried. The system includes an upright drying chamber having an inlet at its lower end and an outlet at its upper end, the parts to be dried being supported in a work zone between the inlet and outlet. Coupled to the inlet of the drying chamber is an input chamber having a blower therein which blows a heated gas into the drying chamber through a filter unit covering the inlet thereto. The blower creates a negative pressure in the input chamber and a positive pressure in the drying chamber in which the filtered heated gas acts to evaporate moisture from the parts in the work zone.

Surrounding the drying chamber and communicating with the input chamber is an annular duct which due to negative pressure in the input chamber draws heated moist gas from the outlet of the drying chamber into the input chamber for recirculation in the drying chamber in a toroidal flow pattern. Because the heated gas flowing through the annular duct envelopes the drying chamber, it acts to maintain this chamber at a uniform operating temperature to promote uniform drying of the parts.

BRIEF DESCRIPTION OF DRAWING

For a better understanding of the invention, as well as further features thereof, reference is made to the detailed description thereof to be read in connection with the annexed drawings wherein.

DESCRIPTION OF INVENTION

Figure 1:
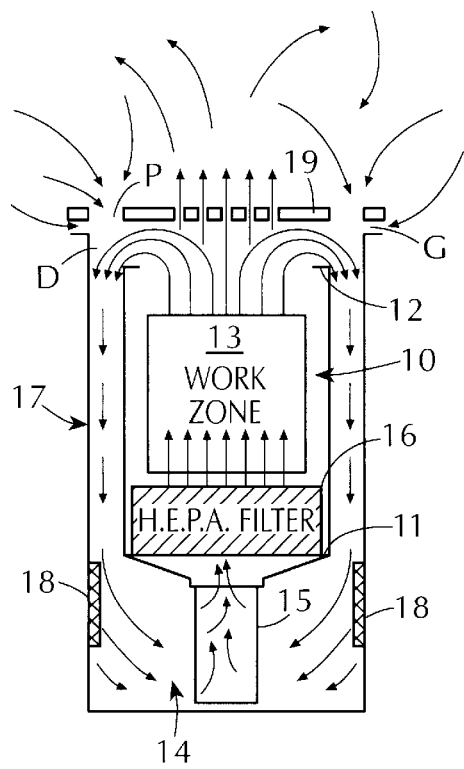
FIG. 1 schematically illustrates the structure of a system in accordance with the invention for drying critical parts.

Referring first to FIG. 1, shown therein in schematic form is an air drying system in accordance with the invention, the system including an upright drying chamber 10 This chamber has a rectangular cross section formed by four walls defining an inlet 11 at its lower end and an outlet 12 at its upper end.

Disposed within drying chamber 10 intermediate inlet 11 and outlet 12 in a work zone 13 in which the critical parts to be fully dried are supported in an open rack. As a consequence, as indicated by the flow arrows in FIG. 1, heated air flows through work zone 13 from inlet 11 to outlet 12 to evaporate moisture from the parts supported in this zone.

Coupled to the lower end of drying chamber 10 is an input chamber 4 having a blower 15 therein which sucks in heated air and blows it into drying chamber 10 through a box-like Hepa filter unit 16 which covers inlet 11. Hence the submicron filter unit intercepts the heated air blown by the blower into the drying chamber.

A preferred form of Hepa filter unit is one composed of a continuous sheet of non-woven, non-combustible microglass fibers having high tensile strength and water-repellent properties This non-woven sheet is accordion-folded over narrow fluted corrugated aluminum separators supported within a frame and bonded thereto by sealants. Also provided are gaskets on either face of the frame to form a leakproof seal at the air exit face of the filter unit.

In practice, the separators in the Hepa filter may be made of high grade stainless steel, titanium or other metallic or non-metallic materials, or separators may be omitted from the filter.

It is essential that the Hepa filter unit be capable of functioning at elevated temperatures which promote evaporation of moisture from the wet parts. This unit acts to filter out particles borne by the heated air forced through the filter, including particles of submicron size. The heated, filtered, air emerges from the exit face of the filter as a laminar stream which flows through the drying chamber and effects uniform evaporative drying of the wet parts supported in work zone 13.

Surrounding drying chamber 10 and communicating with inlet chamber 14 below the drying Chamber is an annular duct 17 formed by four walls parallel to the respective four walls of the drying chamber. The four walls defining duct 17 are somewhat higher than those defining the drying chamber to create above outlet 12 of the drying chamber a duct input D. In practice, the walls of the drying chamber and those of the duct may be formed of stainless steel or other suitable material satisfying the structural requirements of the drying chamber.

Mounted against the inner surface of each wall forming annular duct 17 adjacent input chamber 14 is an electrical heater pad 18. Because these pads are distributed about the annular duct, they act to uniformly heat air drawn through this duct by blower 15. In practice the blower itself may incorporate a heater-element, thereby dispensing with the need for pads 18.

Instead of a heater pad 18 mounted against each wall forming the duct use is preferably made of a stainless steel finned heating element suspended in the annular duct in a manner which forces air flow around and in between the fins to ensure exposure to the massive surface area. Thus it becomes possible to use in the duct four low wattage finned heating elements which due to the low wattage density of the system ensures that neither the heater elements nor the fins ever oxidize or change color.

Covering outlet 12 of the drying chamber 10 and input D of duct 17 surrounding this chamber is a damper 19 having adjustable ports P to permit controlled discharge of moisture laden heated air from outlet 12 of the drying chamber as well as the intake of ambient air into input D of the duct.

Blower 15 in input chamber 14 which forces heated air through Hepa filter unit 16 into drying chamber 10, produces a positive pressure in the drying chamber and a negative pressure in the input chamber coupled to the drying chamber. As a result of this negative pressure, moist hot air emerging from the drying chamber as a result of evaporative drying of the parts, is drawn into duct 17 through its input D. The moist, hot air flowing back through duct 17 into input chamber 14 is blown into drying chamber 10 by blower 15, thereby recirculating the heated air to conserve thermal energy.

Figure 4:
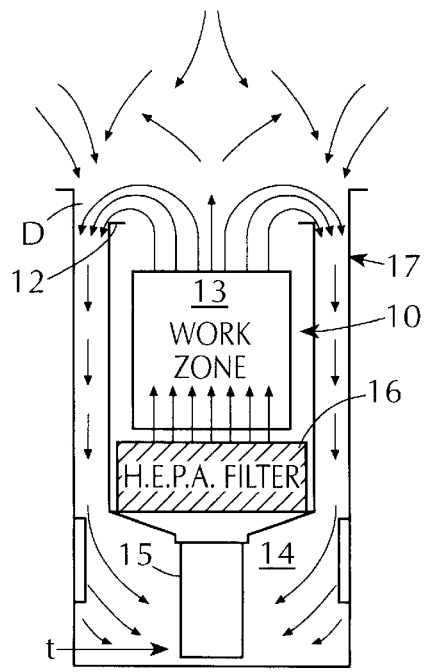
FIG. 4 illustrates the toroidal gas flow pattern produced in the system when the cover is fully open.

Because the drying chamber, when the blower is operative, is maintained at a positive pressure at all times, this precludes entrainment of ambient air into the drying chamber, even when damper 19 is fully open, as illustrated in FIG. 4. Annular duct 17 which surrounds drying chamber 10 gives rises to a toroidal flow pattern, for as indicated by the arrows in FIG. 1, the moist, heated air spills over outlet 12 of the drying chamber into input D of annular duct 17, to be conducted thereby into input chamber 14 from which it is blown back into the drying chambers Because the lines of flow are uniformly distributed throughout the annular duct which surrounds the drying chamber, the resultant toroidal flow pattern subjects the wet parts in the work zone to a uniform drying action. As a consequence, there are no stagnant regions in the drying chamber in which parts are not dried, and streaking of the parts is avoided.

Because drying chamber 10 is enveloped by annular duct 17, there is created a concentric blanket of heated air about the drying chamber. This blanket acts to maintain the drying chamber at a uniform operating temperature to promote uniform drying of the parts. In effect, the drying chamber is enveloped in a hot cocoon.

When in the arrangement shown in FIG. 1, damper 19 is closed, there remains a peripheral gap G between the damper and the upper end of drying chamber 10 and annular duct 17 concentric with the chamber.

The near-zero mean pressure gradient around the peripheral gap G between the damper and the chamber minimizes the discharge of heated process air from the drying chamber and the intake of ambient air into the annular duct. Hence in this mode of operation, the removal of moist heated air does not take place until the damper is opened at the end of the drying cycle. This operating mode is usually found to be adequate for use when drying optical devices or other substrates having smooths flat non-porous surfaces.

The arrangement shown in FIG. 4 is one in which the damper is fully open; hence the damper is omitted from this drawing. FIG. 4 depicts the purging flow pattern that occurs at the beginning and end of the operating cycle. In this mode of operation, there is a toroidal flow of heated moist air through the drying chamber which effects uniform evaporation drying of all the wet parts. The open damper 19 permits purging of moist heated air from the drying chamber, without however entrainment of environmental air, for the drying chamber is under positive pressure. However, duct 17 surrounding drying chamber 10 is under negative pressure, and when the damper is open, there is then an intake of make-up air into the duct. Thus feeding into input D of the duct, as indicated by the arrows, is atmospheric air which is intermingled with hot moist air emerging from the drying chamber.

Makeup air drawn into duct 17 is prevented from entering the drying chamber in which the parts are being processed, for the pressure gradient forces make up air to join the flow of moist, heated air into the duct. Hence the intake air will be heated along with the rest of the process air before entering the drying chamber through the filter unit to be recirculated therein.

To adjust the system to optimum performance and operating economy for any specific application, the system for drying the parts is operated initially with bleed port P in damper 19 fully closed, thereby limiting moisture removal to a purging phase which occurs when the damper is open at the beginning and end of a drying cycle.

If drying efficiency or drying time is not optimum with the bleed ports closed, subsequent drying cycles are conducted with bleed ports incrementally opened on each successive occasion. At the setting at which the workload has been properly dried in the desired cycle time, the bleed ports are secured in position for operating efficiency has then been optimized.

Figure 5:
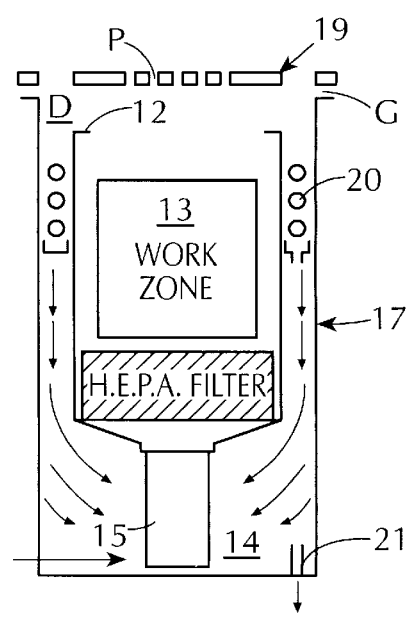
FIG. 5 shows the system when provided with auxiliary condenser coils.

For nearly all applications encountered in critical parts drying processes, the bleed-and-purge arrangements as previously described, provide more than sufficient moisture control to ensure optimum drying performance. In extreme cases however, where the workload configuration is such that unusually large amounts of the moisture must be removed from the workload, the moisture removal capability is augmented by the use of auxiliary condenser coils 20, as illustrated in FIG. 5. These coils are placed in duct 17 and drained from the system through a drain pipe 21. Hence the returning process air, together with ambient air are cooled and stripped of residual moisture in the course of flowing through duct 17. A balancing increase in thermal energy drawn from the heating system provides the means of maintaining desired drying chamber temperature.

Figure 2:
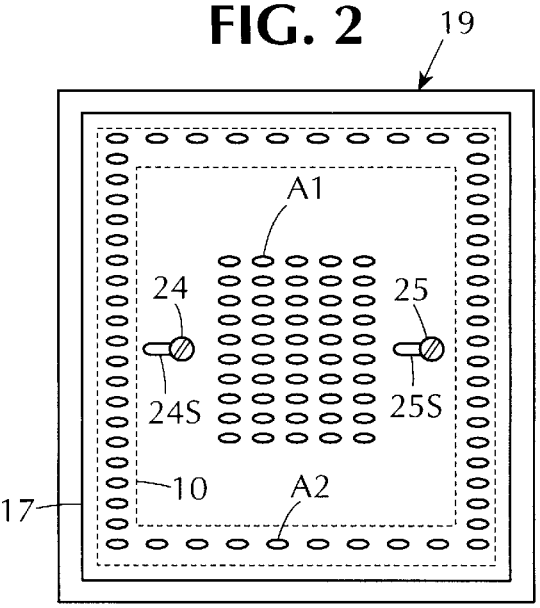
FIG. 2 is a plan view of an adjustable damper assembly which covers the system.
Figure 3:
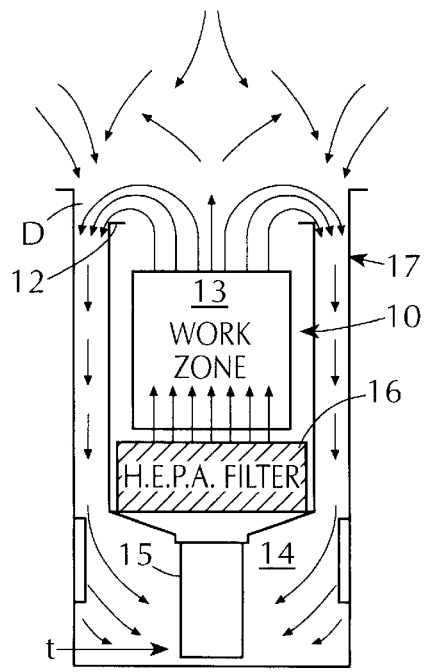
FIG. 3 is a section taken through the damper assembly.

As shown separately in FIGS. 2 and 3, a preferred form of damper 19 for covering drying chamber 10 and annular duct 17 concentric therewith is formed by upper and lower rectangular plates 22 and 23. Each plate has an inner grid $A_1$ of apertures which registers with the drying chamber 10, and a outer grid $A_2$ of apertures, in a square pattern, which registers with annular duct 17.

The two plates are interconnected by a pair screws 24 and 25 which are received in slots 24S and 25S formed in the upper plate whereby upper plate 22 is laterally shiftable with respect to lower plate 23 from a position in which the grids in both plates are in registration with each other to provide fully open ports, to a position in which the grids are out of registration to close these ports. Hence the damper is adjustable to more or less open the ports to the degree required in the course of operating the system The gas used in drying wet parts in the system shown in FIGS. 1 to 5 is atmospheric air. For those drying applications involving critical parts that are oxidation sensitive, such as copper parts or those fabricated of gallium arsenide, an oxygen-free gas is required, typically nitrogen.

To operate the system shown in FIGS. 1 to 5, with nitrogen, one requires a metered source of nitrogen having suitable controls. The nitrogen from this source is injected into input chamber 14 where it is blown through Hepa filter unit into the drying chamber, and from the drying chamber 10 returned through the annular duct 17 back into the input chamber for recirculation in the drying chamber in a toroidal flow pattern.

However, the damper arrangement with nitrogen operation is such that when the nitrogen drying cycle is in progress, no ambient air is then permitted to enter the system. The damper covering the system may be adjusted to allow moist heated nitrogen from the drying chamber to be purged. But since the drying chamber is under positive pressure, no air is entrained therein.

While there has been shown and described preferred embodiments of a laminar flow system for drying critical parts, it will be appreciated that many changes and modifications may be made therein without, however departing from the essential spirit thereof. Thus while the system is disclosed as including a Hepa filter unit, other submicronic filters may be used.

I claim:

1. A system adapted to dry critical parts which in the course of their processing are rendered wet and become contaminated unless fully dried in a uniform pure gas environment, said system comprising:

A. an upright drying chamber having a lower inlet and an upper outlet, wet parts to be dried in a uniform pure gas environment being supported in a work zone between the inlet and the outlet;

B. a filter unit covering the inlet;

C. an input chamber coupled to the inlet having a blower which blows heated gas into the drying chamber through the filter unit, the blower creating a negative pressure in the input chamber and a positive pressure in the drying chamber in which the heated gas acts to evaporate moisture from the parts in the work zone; and D. an annular duct surrounding the drying chamber and communicating with the input chamber whose negative pressure draws heated moist gas emerging from the outlet of the drying chamber into the duct to flow back into the input chamber for recirculation in the drying chamber in a toroidal flow pattern promoting uniform drying of the parts.

2. A system as set forth in claim 1, in which the heated gas flowing back through the annular duct envelopes the drying chamber to maintain the operating temperature therein at a uniform level.

3. A system as set forth in claim 1, in which the filter unit is a Hepa filter.

4. A system as set forth in claim 1, in which the System is covered by an adjustable damper having ports aligned with the drying chamber which permit moist gas to be purged therefrom and ports aligned with the duct which permit intake gas to be drawn therein.

5. A system as set forth in claim 1, in which the drying chamber has a rectangular cross section formed by four walls, and in which the duct is formed by four walls parallel to the walls of the drying chamber.

6. A system as set forth in claim 1, in which the chamber walls and the duct walls are all formed of stainless steel.

7. A system as set forth in claim 5, in which disposed adjacent each wall of the duct is an electrical heating element to heat the gas passing through the duct.

8. A system as set forth in claim 7, in which the heating element is provided with metal fins.

9. A system as set forth in claim 1, further including condenser coils positioned in the duct to condense moisture in the gas flowing through the duct.

10. A system as set forth in claim 1, in which the duct extends above the outlet of the drying chamber to define an input to the duct into which spills gas emerging from the outlet.

11. A system as set forth in claim 1, in which the gas is nitrogen.

12. A system as set forth in claim 10, in which the nitrogen is injected into the input chamber from a nitrogen source.

\* \* \* \* \*